United States Patent
Amako et al.

(10) Patent No.: US 9,853,193 B2
(45) Date of Patent: Dec. 26, 2017

(54) IMPRINTING PROCESS OF HOT-MELT TYPE CURABLE SILICONE COMPOSITION FOR OPTICAL DEVICES

(71) Applicants: Dow Corning Corporation, Midland, MI (US); Dow Corning Toray Co., Ltd., Tokyo (JP)

(72) Inventors: Masaaki Amako, Chiba (JP); Steven Swier, Midland, MI (US); Haruna Yamazaki, Chiba (JP); Shin Yoshida, Chiba (JP); Makoto Yoshitake, Chiba (JP)

(73) Assignees: Dow Corning Corporation, Midland, MI (US); Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 15/316,071

(22) PCT Filed: Jun. 4, 2015

(86) PCT No.: PCT/US2015/034113
§ 371 (c)(1),
(2) Date: Dec. 2, 2016

(87) PCT Pub. No.: WO2015/187909
PCT Pub. Date: Dec. 10, 2015

(65) Prior Publication Data
US 2017/0092822 A1 Mar. 30, 2017

Related U.S. Application Data

(60) Provisional application No. 62/007,554, filed on Jun. 4, 2014.

(51) Int. Cl.
*H01L 33/54* (2010.01)
*G03F 7/00* (2006.01)
(Continued)

(52) U.S. Cl.
CPC .............. *H01L 33/54* (2013.01); *C08G 77/44* (2013.01); *C08J 5/18* (2013.01); *G03F 7/0002* (2013.01);
(Continued)

(58) Field of Classification Search
None
See application file for complete search history.

(56) References Cited

U.S. PATENT DOCUMENTS 6,183,929 B1 * 2/2001 Chow .................. C09D 183/08
399/333
2008/0061679 A1 * 3/2008 Xu ........................ C08G 77/388
313/504
(Continued)

FOREIGN PATENT DOCUMENTS

TW 201609350 A 3/2016
WO WO-2010084918 A1 7/2010
(Continued)

OTHER PUBLICATIONS

"International Application Serial No. PCT/US2015/034113, International Search Report dated Nov. 2, 2015", 3 pgs.
(Continued)

*Primary Examiner* — Bilkis Jahan
(74) *Attorney, Agent, or Firm* — Schwegman Lundberg & Woessner, P.A.

(57) ABSTRACT

The present disclosure relates to a method of making an optical assembly. An optical device is secured in a fixture, the optical device having an optical surface, wherein a silicone film is positioned with respect to the optical surface, the silicone film having a distal surface relative to the optical surface. The method includes, among other features, imprinting the distal surface of the silicone film to create a surface imprint in the distal surface of the silicone film.

20 Claims, 4 Drawing Sheets

(51) Int. Cl.
*C08G 77/44* (2006.01)
*C08J 5/18* (2006.01)
*H01L 31/0203* (2014.01)
*H01L 31/18* (2006.01)
*H01L 33/00* (2010.01)
*H01L 33/56* (2010.01)

(52) U.S. Cl.
CPC .......... *H01L 31/0203* (2013.01); *H01L 31/18* (2013.01); *H01L 33/00* (2013.01); *H01L 33/56* (2013.01); *C08J 2383/10* (2013.01); *H01L 2224/48091* (2013.01); *H01L 2924/1815* (2013.01); *H01L 2933/005* (2013.01)

(56) References Cited

U.S. PATENT DOCUMENTS

| | | | |
|---|---|---|---|
| 2013/0040295 A1* | 2/2013 | Sun | B01L 3/5027 435/6.11 |
| 2013/0200413 A1* | 8/2013 | Kashiwagi | H01L 33/50 257/98 |
| 2014/0091346 A1* | 4/2014 | Fujii | H01L 33/505 257/98 |
| 2014/0175488 A1* | 6/2014 | Kashiwagi | H01L 33/501 257/98 |
| 2014/0277294 A1* | 9/2014 | Jones | A61N 5/062 607/88 |
| 2015/0044417 A1* | 2/2015 | Koike | B29C 59/022 428/137 |

FOREIGN PATENT DOCUMENTS

| | | |
|---|---|---|
| WO | WO-2011059104 A1 | 5/2011 |
| WO | WO-2013109607 A1 | 7/2013 |
| WO | WO-2015187909 A1 | 12/2015 |

OTHER PUBLICATIONS

"International Application Serial No. PCT/US2015/034113, Written Opinion dated Nov. 2, 2015", 5 pgs.

* cited by examiner

IMPRINTING PROCESS OF HOT-MELT TYPE CURABLE SILICONE COMPOSITION FOR OPTICAL DEVICES

CROSS-REFERENCE TO RELATED APPLICATIONS

This application is a U.S. national stage application filed under 35 U.S.C. §371 from International Application Serial No. PCT/US2015/034113, filed on Jun. 4, 2015, and published as WO 2015/187909 on Dec. 10, 2015, and which claims the benefit of priority to U.S. Provisional application Ser. No. 62/007,554, filed on Jun. 4, 2014, which applications and publication are hereby incorporated herein by reference in their entirety.

BACKGROUND

Optical devices, such as optical emitters, optical detectors, optical amplifiers, and the like, may emit or receive light via an optical surface. For various such devices, the optical surface may be or may include an electronic component or other component that may be sensitive to environmental conditions. Certain optical devices such as optoelectronics generally, including light emitting diodes (LEDs), laser diodes, and photosensors, can include solid state electronic components that may be susceptible to electrical shorts or other damage from environmental conditions if not protected. Even optical devices that may not be immediately susceptible may degrade over time if not protected. Accordingly, films have been developed that provide at least some protection to the optical surface from environmental elements.

SUMMARY

A protective film and a method for making such a protective film has been developed that may aid with light extraction from the optical device. In particular, a process has been developed that creates an imprint on a silicone film that may improve light extraction from the optical device. The imprint may be created during manufacturing of an optical assembly including the optical device and the silicone film by pressing a release liner having a related imprint onto the silicone film. The silicone may be a hot melt silicone composition, as disclosed herein. The pressing of the release liner may be during a heating process, such as during lamination. As a result, the imprinting of the silicone film may be concurrent with the lamination of the silicone film to the optical device, resulting in a "one-time" production process, allowing the various components to be positioned with respect to one another in a fixture, such as a vacuum chamber, and the output producing the optical assembly.

DETAILED DESCRIPTION

Figure 1:
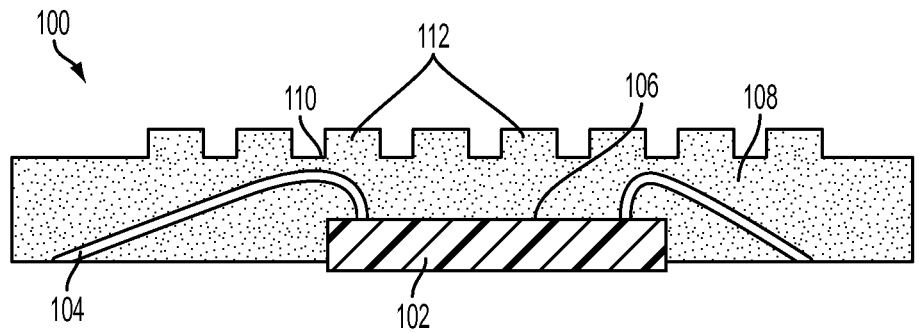
FIG. 1 is a side profile of an optical assembly 100, in an example embodiment.

FIG. 1 is a side profile of an optical assembly 100, in an example embodiment. The optical assembly includes an optical device 102 and electrical leads 104 configured to provide electrical connectivity with the optical device 102, such as to provide a current to cause an LED to illuminate or to detect an output from an optical detector, in various example embodiments. The optical device 102 includes an optical surface 106 from which light may either be emitted or detected. The optical device 102 and the electrical leads 104 are encapsulated in a silicone film 108 that may, in various examples, be applied according to methods disclosed herein. While a silicone film made of various materials as disclosed herein with particularity, the silicone film 108 may be or include any suitable encapsulant that currently exists or that may be developed.

The silicone film 108 includes a distal surface 110 that is distal relative to the optical surface 106. The distal surface 110 has been imprinted to create a pattern of protrusions 112. The protrusions 112 may be bumps, corrugations, ridges, or other related projection. While the protrusions 112 as illustrated are in a pattern and are of regular shape, the protrusions 112 may be unpatterned and may be of irregular shape. Further, some or all of the protrusions 112 may be replaced with dimples, divots, or other indentations in the distal surface 110.

FIGS. 2A-2E are an illustration of a process for making the optical assembly 100, in an example embodiment. While the process is described with respect to the optical assembly 100, it is to be understood that the principles described herein may be applied to making any of a variety of optical assemblies.

Figure 2A:
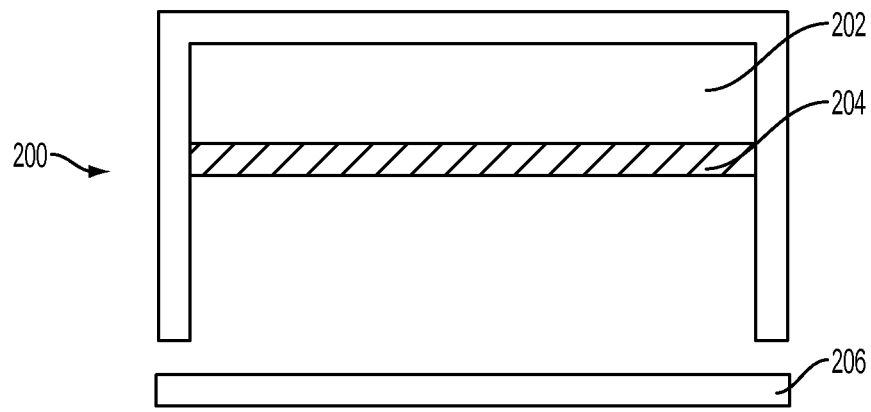
FIGS. 2A-2E are an illustration of a process for making the optical assembly 100, in an example embodiment.

In FIG. 2A, a fixture 200 is made ready to receive the optical device 102 and the silicone film 108. In the illustrated example, the fixture is a vacuum laminator, including a vacuum chamber 202, a membrane 204, and a heat source 206, such as a hotplate table. The membrane 204 may be made of any suitable material including, but not limited to, rubber. In various examples, the fixture 200 does not necessarily include some or all of the components 202, 204, 206, and may instead include a mechanism for securing the optical device 102 and a pressing mechanism, such as a piston or other device that may be utilized to press an object into the silicone film 108, as will be disclosed herein.

Figure 2B:
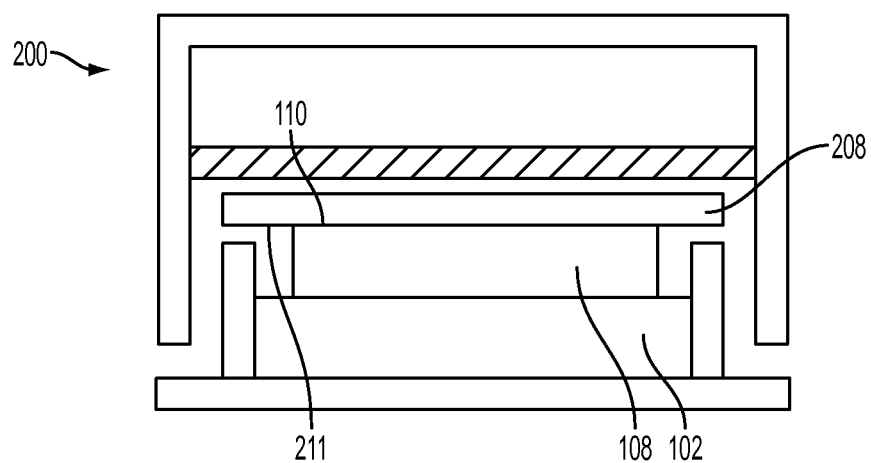

In FIG. 2B, the optical device 102 and the silicone film 108 are positioned within the fixture 200 and a release liner 208 positioned between the distal surface 110 of the silicone film 108 and the membrane 204. An imprint surface 211 faces the distal surface 110 of the silicone film 108. In various examples, the release liner 208 is formed of plastic, such as ethylene tetrafluoroethylene (ETFE). In various examples, the silicone film 108 is not, at this point, attached or otherwise substantially secured to the optical device 102; such securing may come from a lamination or other process as disclosed herein. As such, the silicone film 108 may be loose with respect to the optical device 102 or may be lightly or otherwise non-permanently secured with respect to the optical device 102, such as with a fastener or adhesive. Alternatively, the silicone film 108 may already be secured to the optical device 102, such as through a prior lamination process or other mechanism by which the silicone film 108 may be secured to the optical device 102 over the long term or permanently.

Figure 2C:
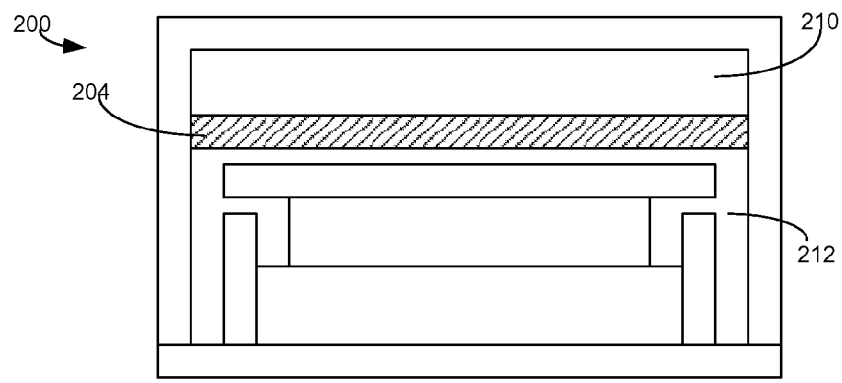

In FIG. 2C, the fixture 200 is closed and a vacuum applied on both a first side 210 and a second side 212 of the membrane 204. In the illustrated example, the membrane 204 serves to isolate the first and second sides 210, 212 with respect to one another, allowing a vacuum to be pulled independently on each side 210, 212.

Figure 2D:
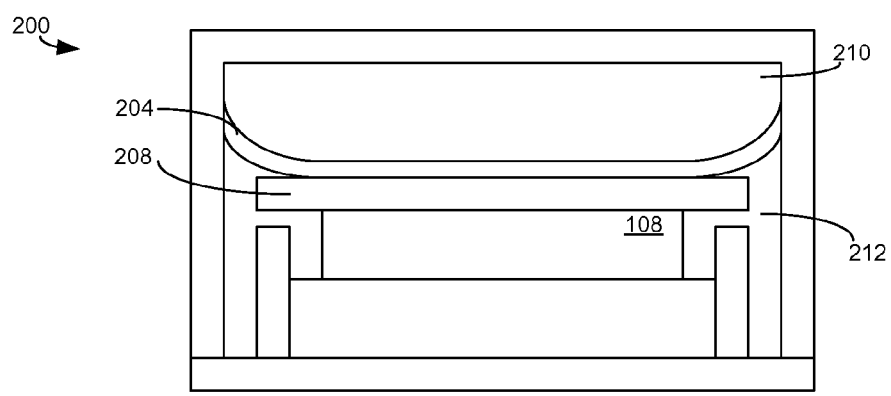

In FIG. 2D, the vacuum is released on the first side 210 while being maintained on the second side 212. Releasing the vacuum on the first side 210 causes the membrane 204 to press on the release liner 208, causing an imprint pattern on the release liner 208 to be imparted onto the silicone film 108.

In an example, the fixture 200 is held at vacuum for times from approximately four (4) minutes to approximately twenty (20) minutes and at a temperature of approximately one hundred thirty-five (135) ° C. In some examples, the fixture is held at vacuum for approximately ten (10) minutes at a temperature of approximately one hundred fifty (150) ° C.

Figure 2E:
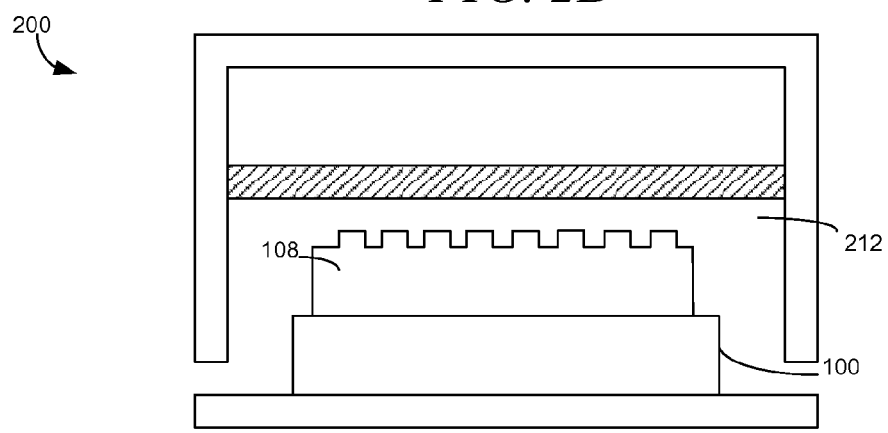

In FIG. 2E, the vacuum is released on the second side 212 and the fixture 200 opened. The optical assembly 100 includes the silicone film 108 including the pattern as imparted from the release liner 208.

While the illustrated fixture 200 includes space for one (1) optical device 102 and resultant optical assembly 100, fixtures 200 may have capacity for multiple optical devices 102 and to produce multiple optical assemblies 100 concurrently. In an example, the optical device 102 has dimensions of two hundred sixty (260) micrometers by five hundred eighty-five (585) micrometers and a thickness of ninety (90) micrometers. The optical device 102 may be part of a board including multiple optical devices 102, such as a fifty (50) by fifty (50) millimeter board including one hundred (100) of the optical devices 102. In such an example, the fixture 200 may be configured to receive the entire board of optical devices 102. In an example, the silicone film 108 is approximately four hundred (400) micrometers thick. The silicone film 108 and/or the release liner 208 may be a single sheet to cover the optical surface 106 of some or all of the optical devices 102 or may be discrete for each optical device 102. In the example where the silicone film 108 is a single sheet, the sheet may have a diameter of approximately thirty-five (35) millimeters.

In various examples, the fixture 200 may be replaced or supplemented with any of a variety of pressing mechanisms that would allow for pressing the release liner 208 against the silicone film 108 to impart the imprint on the silicone film 108. Such a pressing mechanism may act on the release liner 208 directly, i.e., by leaving the optical device 102 and/or the silicone film 108 substantially stationary and actively pressing the release liner 208 against the silicone film 108, may act on the optical device 102 and/or the silicone film 108 directly, i.e., by leaving the release liner 208 substantially stationary and actively pressing the optical device 102 and/or the silicone film 108 against the release liner, or may act on both the release liner 208 and the optical device 102 and/or the silicone film 108 directly. Further, as noted above, in various examples the fixture 200 does not include a heat source 206 and does not necessarily laminate or otherwise secure or attach the silicone film 108 to the optical device 102. Rather, in various examples, the fixture 200 may simply be a press for imparting the imprint onto the silicone film 108.

Figure 3A:
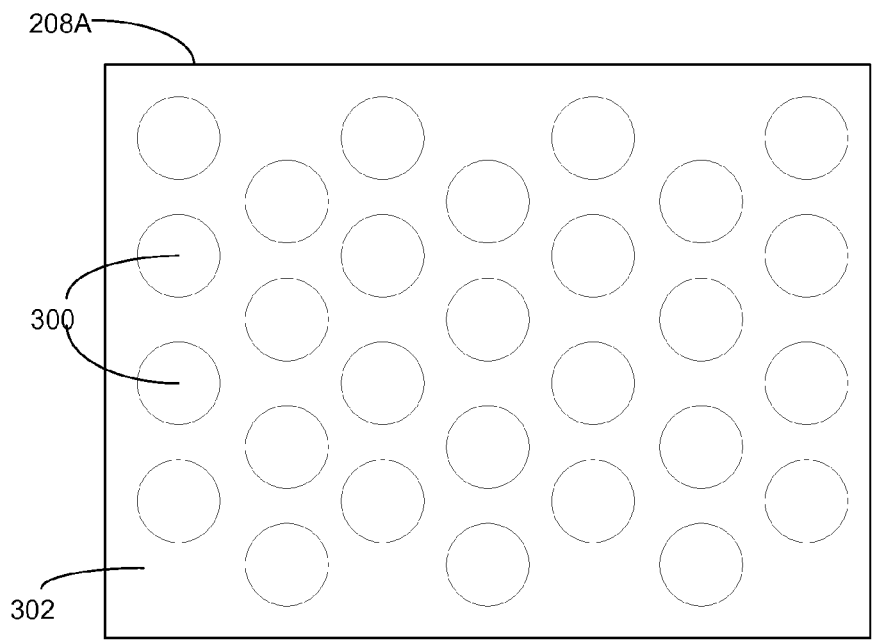
FIGS. 3A and 3B are top profiles of example release liners, in various example embodiments.
Figure 3B:
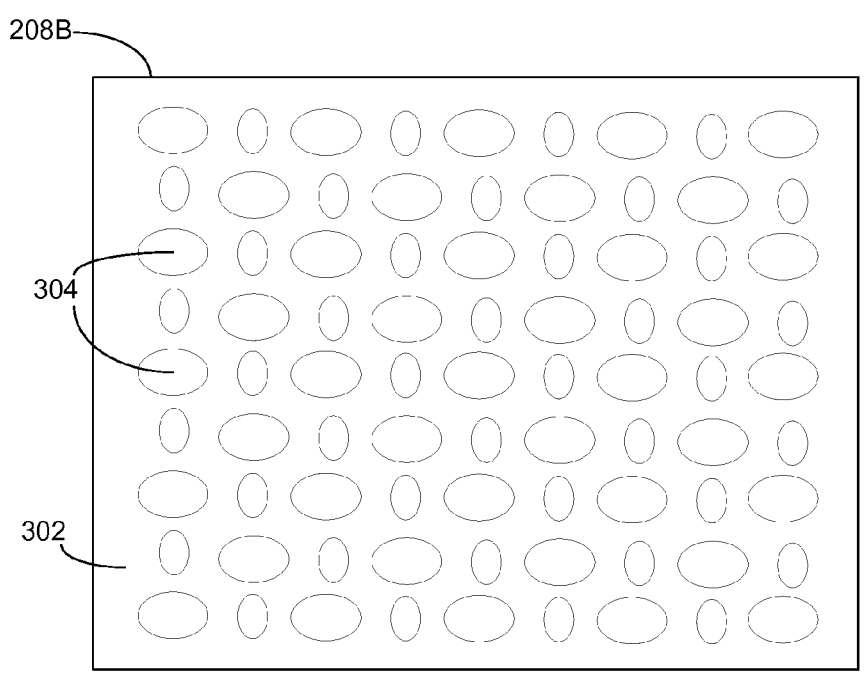

FIGS. 3A and 3B are top profiles of example release liners 208A and 208B, respectively, in various example embodiments. The illustrated release liners 208A, B are presented as representative examples and are non-limiting.

The release liner 208A includes a regular pattern of pillars 300 on a surface 302 that is configured to face the distal surface 110 of the silicone film 108 when the silicone film 108 and the release liner 208A are positioned in the fixture 200. The release liner 208A may be utilized to make the protrusions 112 of the silicone film 108 as illustrated in FIG. 1. In an example, the release liner 208A is formed of a cyclic olefin polymer (COP) having a phi of approximately two hundred thirty (230) nanometers, a pillar height of approximately two hundred (200) nanometers, a pillar pitch of approximately four hundred (400) nanometers, and a film thickness of approximately 200 micrometers.

When the release liner 208A is used, the release liner 208A may be pressed against the silicone film 108 in the vacuum for approximately twenty (20) minutes at one hundred thirty-five (135) ° C. The resultant optical assembly 100 may have protrusions 112 of approximately one hundred twenty (120) to approximately one hundred sixty (160) nanometers in depth.

The release liner 208B includes a micro mesh pattern 304. In various examples, the micro mesh pattern has a mesh count of three hundred twenty-five and a wire diameter of approximately two hundred eighty (280) micrometers. The micro mesh pattern 304 may be formed by hot-pressing a metal micro mesh onto the material of the release liner 208B, as disclosed herein, such as for one (1) minute at one hundred fifty (150) ° C. Additionally or alternatively, the release liner 208B may be the metal micro mesh and may be applied directly to the silicone film 108, as disclosed herein.

Various other release liners 208 are contemplated. In an example, a release liner 208 includes a random or otherwise irregular arrangement of cavities configured to create a random arrangement of protrusions 112 on the silicone film 108. The release liner may include a moth-eye pattern and be formed of metal. The cavities may have a depth of approximately two hundred and twelve (212) nanometers and a pitch of approximately one hundred thirty (130) nanometers. An optical assembly 100 including a silicone film 108 with a resultant arrangement of protrusions 112 may, in various examples, have a LOP of approximately 1,772 milliwatts in comparison with a LOP of the optical device 102 without the silicone film 108 of approximately 1,740 milliwatts, or an improvement of approximately 1.8 percent.

Figure 4:
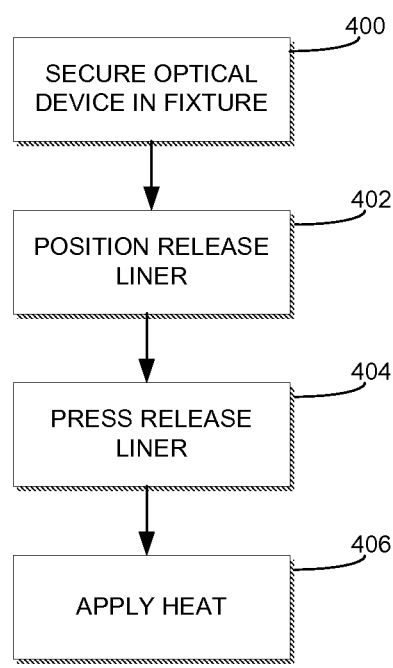
FIG. 4 is a flowchart for making an optical assembly, in an example embodiment

FIG. 4 is a flowchart for making an optical assembly, in an example embodiment. In various examples, the optical assembly is the optical assembly 100. Additionally or alternatively, the method may be applied to making any suitable optical assembly.

At operation 400, an optical device is secured in a fixture, the optical device having an optical surface, wherein a silicone film is positioned with respect to the optical surface, the silicone film having a distal surface relative to the optical surface. In an example, the silicone film comprises a silicone-containing hot melt composition. In an example, the silicone-containing hot melt composition comprises an organosiloxane block copolymer.

In an example, a thickness of the silicone film is greater than a thickness of the optical device.

At operation 402, a release liner is positioned with a liner surface facing the silicone film, the release liner including an imprint on the liner surface. In an example, the imprint of the release liner comprises at least one pillar or one cavity having a primary dimension from approximately ten (10) nanometers to approximately five hundred (500) micrometers. In an example, the imprint of the release liner comprises a plurality of substantially equally sized cavities or pillars. the cavities form a substantially regular pattern. In an example, the release liner is comprised of at least one of a metal and a plastic.

At operation 404, the release liner is pressed against the silicone film, thereby causing the imprint of the release liner to be imparted to the distal surface of the silicone film creating a surface imprint in the distal surface. In an example, the fixture includes a vacuum chamber and a membrane and wherein pressing the release liner comprises creating, with the vacuum chamber, a pressure difference between a first side of the membrane and a second side of the membrane and cause the membrane to press the release liner against the silicone film. There is no limitation upon the material of the membrane. Organic film, patterned film and metal film, release liner are applicable as the membrane.

At operation 406, heat is applied with a heat source to the silicone film to laminate the silicone film to the optical device. In an example, applying heat is at least partially concurrent with pressing the release liner.

Silicone Composition

Generally, when part of a thermoset resin in an unreacted A-stage is reacted, the resin can enter a B-stage in which part of the crosslinkable functional groups are reacted. In A-stage and B-stage, the resin can be reduced in viscosity, softened, or liquefied via heating. If the reaction continues, the resin enters a completely cured C-stage. The curable silicone composition according to the various embodiments of the present invention is in a state corresponding to "A-stage" or "B-stage", and, in particular, is thermoplastic because a curable silicone composition comprising a component that is solid at room temperature is used. It is therefore possible to "plastically" work the hot-melt curable silicone composition for laminating according to the present invention.

As used herein, the term "hot-melt" and "hot-meltable" generally refer to substances that are solid at room temperature (25° C.) but soften or melt when heated, entering a viscous, fluid, or liquid state, such as hot-melt adhesives typified by ethylene vinyl acetate-based adhesives.

The compositions of the various embodiments of the present invention is a "hot-melt" composition or a silicone-containing "hot melt" composition, and therefore can be solid at room temperature (25° C.). There is no particular limitation upon the form of the composition of the present invention; for example, it may take the form of a powder, granules, pellets, tablets, a film, or a sheet.

The compositions of the various embodiments of the present invention have, in some embodiments, a type A durometer hardness of at least 50 at 25° C. as defined by JIS K 6253, at least 60 or at least 70. The composition of the present invention is, in some embodiments, either fluid at 100° C. or has a type A durometer hardness at 100° C. of no more than 10, no more than 5 or no more than 1. If the composition is fluid at 100° C., there is no particular limitation upon the viscosity thereof; a minimum of 0.01 Pa·s or 0.1 Pa·s. The maximum viscosity if the composition is fluid at 100° C. can be 1,000 Pa·s, 100 Pa·s or 10 Pa·s. Alternatively, if the composition is fluid at 100° C., the minimum torque value from immediately after closing the die (cure time: 0 seconds) until 300 seconds, when measuring at a temperature of at least 100° C. using, e.g., a moving die rheometer (MDR) according to JIS K 6300-2 "Rubber, unvulcanized—Physical property—Part 2: Determination of cure characteristics with oscillating curemeters", is no more than 1 kgf·cm or no more than 0.1 kgf·cm. The composition of the present invention can therefore be favorably used as a thermoplastic film or sheet that deforms when heated.

The compositions of the various embodiments of the present invention are capable of undergoing crosslinking and curing when heated. The minimum heating temperature is, in some embodiments, about 50° C., about 80° C. or about 100° C. The maximum heating temperature is, in some embodiments, about 200° C. or about 150° C. In order to stabilize the shape of the seal, the compositions of the various embodiments of the present invention have curing properties such that the time from immediately after beginning measurement until a torque of 1 kgf·cm is reached, when measuring in a heating temperature range using a moving die rheometer (MDR), is no more than 5 minutes, no more than 3 minutes or no more than 1 minute. Measurement can be performed using the MDR according to a method complying with JIS K 6300-2 "Rubber, unvulcanized—Physical property—Part 2: Determination of cure characteristics with oscillating curemeters".

The compositions of the various embodiments of the present invention itself, or the cured product thereof, have, in some embodiments, a refractive index of at least 1.40. The refractive index can be measured using, for example, an Abbe refractometer. In such cases, the wavelength of the light source for the Abbe refractometer can be altered to measure a refractive index at a desired wavelength. The curable silicone composition or cured product thereof has, in some embodiments, a refractive index (at 25° C.) at a visible light wavelength (at 589 nm) of 1.40 or greater, from about 1.50 to about 1.70 or from about 1.55 to about 1.60.

The composition of the present invention itself or the cured product thereof can have a light transmission rate (at 25° C.) of at least about 80%, at least about 90% or at least about 95% (e.g. from about 80% to about 100%, about 80% to about 95%, about 90% to about 100% or about 95% to about 100%). This light transmission rate can be calculated, for example, by measuring the composition of the present invention or the cured product thereof using a light transmission rate (at 25° C.) spectrophotometer using a light path distance of 0.2 cm and a wavelength of 450 nm.

The composition of the present invention is in some embodiments, for example, an A-stage silicone composition that comprises a solid organopolysiloxane and is solid at room temperature, or a B-stage silicone composition that can be crosslinked and cured via a hydrosilylation reaction. In particular, the B-stage composition according to the present invention is, in some embodiments, partially cross-linked via a hydrosilylation reaction, forms a solid with high hardness, specifically, a hard rubber-like state, at room temperature, and either takes on a significantly softened form, specifically, a soft rubber-like state, or liquefies at high temperatures, such as 100° C.

In some embodiments, the compositions of the present invention can be crosslinked and cured via a hydrosilylation reaction. In some embodiments, the compositions are selected from the group consisting of:

(1) an unreacted hydrosilylation curable silicone composition;

(2) a hydrosilylation curable silicone composition obtained by partially cross-linking an unreacted hydrosilylation curable silicone composition; and (3) a hydrosilylation curable silicone composition comprising: a crosslinked product having silicon atom-bonded hydrogen atoms and/or alkenyl groups; and at least one type of hydrosilylation reactive component, the crosslinked product being obtained by cross-linking an unreacted hydrosilylation reactive silicone composition.

In some embodiments, the unreacted hydrosilylation curable (reactive) silicone composition comprises:

(A) at least one type of organopolysiloxane that is solid at 25° C. and has on average more than two alkenyl groups in a molecule;

(B) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (A) being in a range of 0.2 to 4; and (C) a hydrosilylation catalyst in an amount sufficient to effect a hydrosilylation reaction.

There is no limitation upon the molecular structure of component (A); examples include a straight, partially branched straight, branched, dendritic, reticulated, or cyclic structure.

Non-limiting examples of the alkenyl group in component (A) include straight or branched alkenyl groups having from 2 to 10 carbons (e.g., 2 to 8 carbons, 2 to 5 carbons or 2 to 4 carbons), such as vinyl groups, allyl groups, propenyl groups, isopropenyl groups, butenyl groups, pentenyl groups, and hexenyl groups. A vinyl group or allyl group is preferable, and a vinyl group is more preferable. Component (A) can optionally have on average at least three alkenyl groups in a molecule.

Apart from an alkenyl group, component (A) can comprise a monovalent hydrocarbon group bonded to a silicon atom and having from 1 to 20 carbon atoms. Examples of the monovalent hydrocarbon groups include alkyl groups having from 1 to 20 carbon atoms, aryl groups having from 6 to 20 carbon atoms, and aralkyl groups having from 7 to 20 carbon atoms. Examples of the alkyl groups having from 1 to 20 carbon atoms include methyl groups, ethyl groups, propyl groups, isopropyl groups, butyl groups, isobutyl groups, tert-butyl groups, pentyl groups, neopentyl groups, cyclopentyl groups, hexyl groups, cyclohexyl groups, heptyl groups, and other straight, branched, or cyclic alkyl groups. The monovalent hydrocarbon group is preferably a methyl group. Examples of the aryl groups having from 6 to 20 carbon atoms include phenyl groups, tolyl groups, xylyl groups, naphthyl groups, and anthracenyl groups. Examples of the aralkyl groups having from 7 to 20 carbon atoms include benzyl groups, phenethyl groups, and phenylpropyl groups. Part of the hydrogen atoms of the monovalent hydrocarbon group may be partially substituted by halogen atoms, hydroxyl groups, epoxy groups, or the like.

Examples of component (A) include methylvinylpolysiloxane capped at both molecular terminals with trimethylsiloxy groups, copolymers of methylvinylsiloxane and dimethylsiloxane capped at both molecular terminals with trimethylsiloxy groups, methylvinylpolysiloxane capped at both molecular terminals with dimethylvinylsiloxy groups, copolymers of dimethylsiloxane and methylvinylsiloxane capped at both molecular terminals with dimethylvinylsiloxy groups, cyclic methylvinylsiloxane, cyclic dimethylsiloxane-methylvinylsiloxane copolymer, copolymers constituted by siloxane units represented by the formula $(CH_3)_3SiO_{1/2}$, siloxane units represented by the formula $(CH_2\!=\!CH)(CH_3)_2SiO_{1/2}$, and siloxane units represented by the formula $SiO_{4/2}$, copolymers constituted by siloxane units represented by the formula $(CH_2\!=\!CH)(CH_3)_2SiO_{1/2}$ and siloxane units represented by the formula $SiO_{4/2}$, copolymers of siloxane units represented by the formula $(CH_3)_3SiO_{1/2}$, siloxane units represented by the formula $(CH_2\!=\!CH)(CH_3)_2SiO_{1/2}$, siloxane units represented by the formula $(CH_3)_2SiO_{2/2}$, and siloxane units represented by the formula $SiO_{4/2}$, and mixtures of two or more of the above. Dimethylpolysiloxane capped at both molecular terminals with dimethylvinylsiloxy groups, copolymers of dimethylsiloxane and methylvinylsiloxane capped at both molecular terminals with trimethylsiloxy groups, and copolymers of siloxane units represented by the formula $SiO_{4/2}$ and siloxane units represented by the formula $(CH_2\!=\!CH)(CH_3)_2SiO_{1/2}$ are preferred.

Component (A) can be, in some embodiments, a phenyl group-containing organopolysiloxane represented by the following average unit formula:

$$(R^1{}_3SiO_{1/2})_a(R^1{}_2SiO_{2/2})_b(R^1SiO_{3/2})_c(SiO_{4/2})_d$$
$$(R^2O_{1/2})_e$$

wherein:
$R^1$ is a phenyl group, an alkyl group or cycloalkyl group having from 1 to 6 carbon atoms, or an alkenyl group having from 2 to 6 carbon atoms, provided that from 60 to 80 mol % of $R^1$ are phenyl groups, and from 10 to 20 mol % of $R^1$ are alkenyl groups;

$R^2$ is a hydrogen atom or an alkyl group having from 1 to 6 carbon atoms; and "a", "b", "c", "d", and "e" are numbers that satisfy: $0 \leq a \leq 0.2$, $0.2 \leq b \leq 0.7$, $0.2 \leq c \leq 0.6$, $0 \leq d \leq 0.2$, $0 \leq e \leq 0.1$, and $a+b+c+d=1$.

Examples of the alkyl group of $R^1$ include methyl groups, ethyl groups, propyl groups, butyl groups, pentyl groups, and hexyl groups. Examples of the cycloalkyl group of $R^1$ include cyclopentyl groups and cyclohexyl groups. Examples of the alkenyl group of $R^1$ include vinyl groups, allyl groups, butenyl groups, pentenyl groups, and hexenyl groups.

In some embodiments, $R^1$ represents a phenyl group. In some embodiments, the phenyl group content is in a range of 60 to 80 mol % or from 65 to 80 mol %. While not wishing to be bound by any particular theory, it is believed that there can be insufficient softening of the composition of the various embodiments of the present invention at high temperatures if the phenyl group content is less than the minimum value of the range given herein. There can also be a loss of transparency and/or reduction in mechanical strength of the composition of the various embodiments of the present invention, or a cured product thereof, if the phenyl group content exceeds the maximum value of the range given herein.

In some embodiments, $R^1$ represents an alkenyl group. In some embodiments, the alkenyl group content is in a range of 10 to 20 mol %. While not wishing to be bound by any particular theory, it is believed that if the alkenyl group content is less than the minimum value of the range given herein, can be insufficiently hard at room temperature. In some instances, if the alkenyl group content exceeds the maximum value of the range given herein, there can be insufficient softening of the composition of the present invention at high temperatures.

Examples of the alkyl group of $R^2$ include methyl groups, ethyl groups, propyl groups, butyl groups, pentyl groups, and hexyl groups, with methyl groups and ethyl groups being preferable.

In the formula, "a" is a number indicating the fraction of siloxane units represented by the general formula: $R^1{}_3SiO_{1/2}$, and "a" is a number satisfying $0 \leq a \leq 0.2$, and preferably $0 \leq a \leq 0.1$. While not wishing to be bound by any particular theory, it is believed that the composition of the present invention can be insufficiently hard at room temperature if "a" exceeds the maximum value of the range given herein.

In the formula, "b" is a number indicating the fraction of siloxane units represented by the general formula: $R^1{}_2SiO_{2/2}$, and "b" is a number satisfying $0.2 \leq b \leq 0.7$, and preferably $0.4 \leq b \leq 0.7$. While not wishing to be bound by any particular theory, it is believed that insufficient softening of the composition of the present invention at high temperatures can result if "b" is less than the minimum value of the range given herein. In some instances, there can be insufficient hardness of the composition of the present invention at room temperature if "b" exceeds the maximum value of the range given herein.

In the formula, "c" is a number indicating the fraction of siloxane units represented by the general formula: $R^1SiO_{3/2}$, and "c" is a number satisfying $0.2 \leq c \leq 0.6$, and preferably $0.3 \leq c \leq 0.6$. While not wishing to be bound by any particular theory, it is believed that insufficient hardness of the composition of the present invention at room temperature can result if "c" is less than the minimum value of the range given herein. In some instances, insufficient softening of the composition of the present invention at high temperatures can result if "c" exceeds the maximum value of the range given herein.

In the formula, "d" is a number indicating the fraction of siloxane units represented by the general formula: $SiO_{4/2}$, and "d" is a number satisfying $0 \leq d \leq 0.2$, and preferably $0 \leq d \leq 0.1$. While not wishing to be bound by any particular theory, it is believed that insufficient softening of the composition of the present invention at high temperatures can result if "d" exceeds the maximum value of the range given herein.

In the formula, "e" is a number indicating the fraction of units represented by the general formula: $R^2O_{1/2}$, and "e" is a number satisfying $0 \leq e \leq 0.1$. While not wishing to be bound by any particular theory, it is believed that insufficient hardness of the composition of the present invention at room temperature can result if "e" exceeds the maximum value of the range given herein. Furthermore, the sum of "a", "b", "c", and "d" in the formula is 1.

In some embodiments, component (A) can be a mixture of:
(A-1) from 60 to 100 mass % of a branched organopolysiloxane that is solid at 25° C. and has on average more than two alkenyl groups in a molecule; and
(A-2) from 0 to 40 mass % of a straight or partially branched organopolysiloxane that is liquid at 25° C. and has on average more than two alkenyl groups in a molecule.

In some embodiments, component (A-1) is the primary component of the composition, and can be the component already described as component (A).

In some embodiments, component (A-2) is a component for improving the ease of handling and workability of the composition and modifying the hardness thereof at room temperature, and is preferably a phenyl group-containing organopolysiloxane represented by the following general formula:

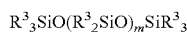

$$R^3_3SiO(R^3_2SiO)_mSiR^3_3$$

wherein:
$R^3$ is a phenyl group, an alkyl group or cycloalkyl group having from 1 to 6 carbon atoms, or an alkenyl group having from 2 to 6 carbon atoms, provided that from 40 to 70 mol % of $R^3$ are phenyl groups, and at least one of $R^3$ is an alkenyl group; and "m" is an integer from 5 to 100.

Examples of the alkyl group of $R^3$ include methyl groups, ethyl groups, propyl groups, butyl groups, pentyl groups, and hexyl groups. Examples of the cycloalkyl group of $R^3$ include cyclopentyl groups and cyclohexyl groups. Examples of the alkenyl group of $R^3$ include vinyl groups, allyl groups, butenyl groups, pentenyl groups, and hexenyl groups.

In some embodiments, $R^3$ represents a phenyl group. In some embodiments, the phenyl group content is in a range of 40 to 70 mol % or from 40 to 60 mol %. While not wishing to be bound by any particular theory, it is believed that insufficient softening of the composition of the present invention at high temperatures can result if the phenyl group content is less than the minimum value of the range given herein. In other embodiments, loss of transparency and/or reduction in mechanical strength in the cured composition of the present invention can result if the phenyl group content exceeds the maximum value of the range given herein. Moreover, at least one of $R^3$ is an alkenyl group. While not wishing to be bound by any particular theory, it is believed that non-incorporation of the component into the crosslinking reaction and bleeding out of the composition of the present invention can result if there is no alkenyl group.

In the formula, "m" is an integer in a range of 5 to 100, and preferably is an integer in a range of 10 to 50. While not wishing to be bound by any particular theory, it is believed that the mechanical strength of the composition of the present invention can be diminished if "m" is less than the minimum value of the range given herein. In some embodiments, the ease of handling and workability of the composition of the present invention can be diminished if "m" exceeds the maximum value of the range given herein.

In some embodiments, component (B) functions as a crosslinking agent having a viscosity at 25° C. in a range of 1 to 1,000 mPa·s, in a range of 1 to 500 mPa·s or in a range of 1 to 100 mPa·s.

There is no limitation upon the molecular structure of component (B); examples include a straight, partially branched straight, branched, dendritic, reticulated, or cyclic structure. Component (B) may optionally have at least three silicon-bonded hydrogen atoms in a molecule.

Apart from a silicon atom-bonded hydrogen atom, component (B) can have a monovalent hydrocarbon group bonded to a silicon atom and having from 1 to 20 carbon atoms. Examples of the monovalent hydrocarbon groups include alkyl groups having from 1 to 20 carbon atoms, aryl groups having from 6 to 20 carbon atoms, and aralkyl groups having from 7 to 20 carbon atoms. Examples of the alkyl groups having from 1 to 20 carbon atoms in component (B) include methyl groups, ethyl groups, propyl groups, isopropyl groups, butyl groups, isobutyl groups, tert-butyl groups, pentyl groups, neopentyl groups, cyclopentyl groups, hexyl groups, cyclohexyl groups, heptyl groups, and other straight, branched, or cyclic alkyl groups. The monovalent hydrocarbon group is preferably a methyl group. Examples of the aryl groups having from 6 to 20 carbon atoms include phenyl groups, tolyl groups, xylyl groups, naphthyl groups, and anthracenyl groups. Examples of the aralkyl groups having from 7 to 20 carbon atoms include benzyl groups, phenethyl groups, and phenylpropyl groups. Part of the hydrogen atoms of the monovalent hydrocarbon group may be partially substituted by halogen atoms, hydroxyl groups, epoxy groups, or the like.

Examples of component (B) include methylhydrogenpolysiloxane capped at both molecular terminals with trimethylsiloxy groups, copolymer of dimethylsiloxane and methyl hydrogensiloxane capped at both molecular terminals with trimethylsiloxy groups, methylhydrogenpolysiloxane capped at both molecular terminals with dimethylhydrogensiloxy groups, copolymer of dimethylsiloxane and methylhydrogensiloxane capped at both molecular terminals with dimethylhydrogensiloxy groups, cyclic methylhydrogensiloxane, cyclic dimethylsiloxane-methylhydrogensiloxane copolymer, copolymers of siloxane units represented by the formula $(CH_3)_3SiO_{1/2}$, siloxane units represented by the formula $H(CH_3)_2SiO_{1/2}$ and siloxane units represented by the formula $SiO_{4/2}$, copolymers of siloxane units represented by the formula $H(CH_3)_2SiO_{1/2}$ and siloxane units represented by the formula $SiO_{4/2}$, copolymers of siloxane units represented by the formula $(CH_3)_3SiO_{1/2}$, siloxane units represented by the formula $H(CH_3)_2SiO_{1/2}$, siloxane units represented by the formula $(CH_3)_2SiO_{2/2}$ and siloxane units represented by the formula $SiO_{4/2}$, and mixtures of two or more of these; in particular, methylhydrogenpolysiloxane capped at both molecular terminals with trimethylsiloxy groups, copolymer of dimethylsiloxane and methylhydrogensiloxane capped at both molecular terminals with trimethylsiloxy groups, and copolymers of siloxane units represented by the formula $SiO_{4/2}$ and siloxane units represented by the formula $H(CH_3)_2SiO_{1/2}$ are preferable.

In some embodiments, from 30 to 70 mol % of the monovalent hydrocarbon groups of component (B) are phenyl groups. While not wishing to be bound by any particular theory, it is believed that insufficient softening of the composition of the present invention at high temperatures can result if the phenyl group content is less than the minimum value of the range given herein. Loss of transparency and/or reduction in mechanical strength in the cured composition of the present invention can result if the phenyl group content exceeds the maximum value of the range given herein.

In some embodiments, component (B) is an organotrisiloxane represented by the following general formula:

In some embodiments, $R^4$ is a phenyl group, or an alkyl group or cycloalkyl group having from 1 to 6 carbon atoms. Examples of the alkyl group of $R^4$ include methyl groups, ethyl groups, propyl groups, butyl groups, pentyl groups, and hexyl groups. Examples of the cycloalkyl group of $R^4$ include cyclopentyl groups and cyclohexyl groups. In some embodiments, the phenyl group content of $R^4$ is in a range of 30 to 70 mol %.

In some embodiments, component (B) content is an amount such that the molar ratio of silicon atom-bonded hydrogen atoms therein to the total amount of alkenyl groups in component (A) is in a range of 0.2 to 4, preferably from 0.5 to 2, more preferably from 0.8 to 1.8, and still more preferably from 0.5 to 1.5. While not wishing to be bound by any particular theory, it is believed that insufficient hardness of the composition of the present invention at room temperature can result if the content of component (B) is outside the range given herein.

Component (C) is a hydrosilylation reaction catalyst for causing or promoting a hydrosilylation reaction between the alkenyl groups of component (A) and the silicon atom-bonded hydrogen atoms of component (B). Examples of component (C) include platinum-based catalysts, rhodium-based catalysts, and palladium-based catalysts. Platinum-based catalysts are preferred due to the ability to promote curing of the present composition. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being particularly preferred. Examples of the alkenylsiloxane include 1,3-divinyl-1,1,3,3-tetramethyldisiloxane, 1,3,5,7-tetramethyl-1,3,5,7-tetravinylcyclotetrasiloxane, alkenylsiloxanes having part of the methyl groups of these alkenylsiloxane substituted by ethyl groups, phenyl groups, or the like, and alkenylsiloxanes having vinyl groups of these alkenylsiloxane substituted by allyl groups, hexenyl groups, or the like. 1,3-divinyl-1,1,3,3-tetramethyldisiloxane is particularly preferred due to high stability of the platinum-alkenylsiloxane complex. Due to the ability for improving the stability of the platinum-alkenylsiloxane complexes, combination is recommended of the platinum-alkenylsiloxane complexes with organosiloxane oligomers such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinyl cyclotetrasiloxane, or the like alkenylsiloxane, or dimethylsiloxane oligomers. The addition of alkenylsiloxanes is preferred.

There is no particular limitation upon component (C) content as long as it is an amount sufficient to effect or promote a hydrosilylation reaction between the alkenyl groups of component (A) and the silicon atom-bonded hydrogen atoms of component (B), but it is, in some embodiments, an amount such that the amount of metal elements in terms of mass units in the component with respect to the composition prior to partial curing is within a range from 0.01 to 500 ppm, from 0.01 to 100 ppm or from 0.01 to 50 ppm. While not wishing to be bound by any particular theory, it is believed that the composition can exhibit a tendency not to sufficiently crosslink if the amount of component (C) is less than the lower limit of the range described herein. In some instances, discoloration of the composition according to the present invention can occur if the amount exceeds the upper limit of the range described herein.

The hydrosilylation curable silicone composition (2) obtained by partially cross-linking an unreacted hydrosilylation curable silicone composition can be obtained by stopping a hydrosilylation reaction at from 50 to 95% conversion of a hydrosilylation reactive silicone composition comprising:

(D) at least one type of organopolysiloxane having on average more than two alkenyl groups in a molecule;

(E) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (D) being in a range of 0.2 to 4; and (F) a hydrosilylation catalyst in an amount sufficient to effect a hydrosilylation reaction.

Components (A) to (C) described herein can be used for components (D) to (F), respectively.

There is no particular limitation upon the viscosity of the unreacted hydrosilylated curable silicone composition can be in a range of 100 to 1,000,000 mPa·s or from 500 to 50,000 mPa·s. While not wishing to be bound by any particular theory, it is believed that the mechanical strength of the composition of the present invention can be diminished if the viscosity is less than the minimum value of the range given here. In some instances, the ease of handling and workability of the composition of the present invention can be diminished if the viscosity exceeds the maximum value of the range given herein.

Component (D) comprises, in some embodiments, a mixture of:

(D-1) an organopolysiloxane represented by the following average unit formula:

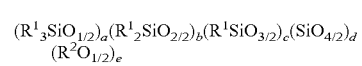

wherein $R^1$ is a phenyl group, an alkyl group or cycloalkyl group having from 1 to 6 carbons, or an alkenyl group having from 2 to 6 carbons, providing that from 60 to 80 mol % of $R^1$ are phenyl groups and from 10 to 20 mol % of $R^1$ are alkenyl groups; $R^2$ is a hydrogen atom or an alkyl group having from 1 to 6 carbons; and "a", "b", "c", "d", and "e"

are numbers that satisfy: $0 \leq a \leq 0.2$, $0.2 \leq b \leq 0.7$, $0.2 \leq c \leq 0.6$, $0 \leq d \leq 0.2$, $0 \leq e \leq 0.1$, and $a+b+c+d=1$;
and (D-2) an organopolysiloxane represented by the following general formula:

$$R^3{}_3SiO(R^3{}_2SiO)_m SiR^3{}_3$$

wherein $R^3$ is a phenyl group, an alkyl group or cycloalkyl group having from 1 to 6 carbons, or an alkenyl group having from 2 to 6 carbons, providing that from 40 to 70 mol % of $R^3$ are phenyl groups and at least one $R^3$ is an alkenyl group; and "m" is an integer from 5 to 100, in an amount of this component being from 0 to 20 parts by weight per 100 parts by weight of component (D-1).

Component (D-2) content may be an amount in a range of 0 to 15 parts by weight per 100 parts by weight of component (D-1), or an amount in a range of 0 to 10 parts by weight. While not wishing to be bound by any particular theory, it is believed that insufficient softening of the composition of the present invention at high temperatures can result if component (D-2) content exceeds the maximum value of the range given herein.

The "conversion" of the hydrosilylation reaction is the degree of consumption of the alkenyl groups of component (D) or the silicon atom-bonded hydrogen atoms of component (E); for example, 80% conversion can indicate that 80% of the alkenyl groups of component (D) or the silicon atom-bonded hydrogen atoms of component (E) have been consumed in the hydrosilylation reaction.

There is no particular limitation upon the method used to control conversion; for example, the unreacted hydrosilylation curable silicone composition can be heated for a comparatively short time to yield a conversion of from 50 to 95%. The heating temperature is, in some embodiments, from 50 to 200° C. or from 80 to 150° C. The heating time is, in some embodiments, from 1 to 20 minutes or from 5 to 15 minutes. Conversion can be measured against, for example, the heat-generating peak area obtained by measuring the unreacted composition via differential scanning calorimetry (DSC) as a reference.

The hydrosilylation curable silicone composition (3) contains:

(G) an alkenyl group-containing crosslinked product obtained by hydrosilylation reaction of an unreacted hydrosilylation reactive silicone composition comprising:
(G-1) at least one type of organopolysiloxane having on average more than two alkenyl groups in a molecule;
(G-2) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (G-1) being in a range of 0.3 to 0.9; and
(G-3) a hydrosilylation catalyst in an amount sufficient to effect a hydrosilylation reaction; and
(H) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in the crosslinked product being in a range of 0.1 to 2.0.

Components (A), (B), (C), and (E) described above can be used for the components (G-1), (G-2), (G-3), and (H), respectively.

In some embodiments, one or more of the following conditions is satisfied:

(G-1) is an organopolysiloxane having on average more than two alkenyl groups in a molecule and represented by the following average composition formula:

$$R^4{}_x SiO_{(4-x)/2}$$

wherein $R^4$ independently represents a substituted or unsubstituted monovalent hydrocarbon group, provided that from 0.1 to 40 mol % of $R^4$ are alkenyl groups; and "x" is a positive number such that $1 \leq x < 2$;

(G-2) is a diorganopolysiloxane represented by the following general formula:

$$HR^5{}_2Si(R^5{}_2SiO)_n R^5{}_2SiH$$

wherein $R^5$ independently represents a substituted or unsubstituted monovalent hydrocarbon group not comprising an aliphatic unsaturated bond, and "n" is an integer from 0 to 1,000;
and (H) is an organohydrogenpolysiloxane represented by the following average composition formula:

$$R^5{}_y H_z SiO_{(4-y-z)/2}$$

wherein $R^5$ is as defined above, and "y" and "z" are positive numbers that satisfy: $0.7 \leq y \leq 2.1$, $0.001 \leq z \leq 1.0$, and $0.8 \leq y+z \leq 2.6$.

The monovalent hydrocarbon group and alkenyl group are as described herein. Examples of the monovalent hydrocarbon groups not comprising an aliphatic unsaturated bond include alkyl groups having from 1 to 20 carbon atoms, aryl groups having from 6 to 20 carbon atoms, and aralkyl groups having from 7 to 20 carbon atoms. Examples of the alkyl groups having from 1 to 20 carbon atoms include methyl groups, ethyl groups, propyl groups, isopropyl groups, butyl groups, isobutyl groups, tert-butyl groups, pentyl groups, neopentyl groups, cyclopentyl groups, hexyl groups, cyclohexyl groups, heptyl groups, and other straight, branched, or cyclic alkyl groups. The monovalent hydrocarbon group is preferably a methyl group. Examples of the aryl groups having from 6 to 20 carbon atoms include phenyl groups, tolyl groups, xylyl groups, naphthyl groups, and anthracenyl groups. Examples of the aralkyl groups having from 7 to 20 carbon atoms include benzyl groups, phenethyl groups, and phenylpropyl groups. Part of the hydrogen atoms of the monovalent hydrocarbon group may be partially substituted by halogen atoms, hydroxyl groups, epoxy groups, or the like.

In the hydrosilylation curable silicone composition (3), in some embodiments the relative amounts of components (G-1) and (G-2) are adjusted so that the ratio of the total molar concentration of silicon atom-bonded hydrogen atoms in component (G-2) to the total molar concentration of alkenyl groups in component (G-1) is in a range of 0.3 to 0.9; thus, the crosslinked product obtained by hydrosilylating the unreacted hydrosilylation reactive silicone composition (G) has alkenyl groups not consumed in the hydrosilylation reaction. It is therefore possible to further crosslink and cure the hydrosilylation curable silicone composition (3) via a hydrosilylation reaction as a result of the presence of component (H).

The composition of the present invention can comprise, as an optional component, a reaction retarder such as ethynyl hexanol, 2-methyl-3-Butyn-2-ol, 3,5-dimethyl-1-hexyn-3-ol, 2-phenyl-3-butyn-2-ol, or another other alkyne alcohol; 3-methyl-3-penten-1-yne, 3,5-dimethyl-3-hexen-1-yne, or another enyne compound; 1,3,5,7-tetramethyl-1,3,5,7-tetravinylcyclotetrasiloxane, 1,3,5,7-tetramethyl-1,3,5,7-tetrahexenylcyclotetrasiloxane, or benzotriazole. There is no limitation upon the reaction retarder content, e.g., in a range of 1 to 5,000 ppm with respect to the weight of the composition.

The composition of the present invention can also comprise an adhesion promoter in order to improve bondability to various substrates. Examples of the adhesion promoters include, but are not limited to: organosilanes or linear, branched, or cyclic organosiloxane oligomers having approximately 4 to 20 silicon atoms having a trialkoxysiloxy group (e.g., a trimethoxysiloxy group or triethoxysiloxy group) or a trialkoxysilylalkyl group (e.g., a trimethoxysilylethyl group or triethoxysilylethyl group) and a hydrosilyl group or alkenyl group (e.g., a vinyl group or allyl group); organosilanes or linear, branched, or cyclic organosiloxane oligomers having approximately 4 to 20 silicon atoms having a trialkoxysiloxy group or trialkoxysilylalkyl group, and a methacryloxyalkyl group (e.g., a 3-methacryloxypropyl group); organosilanes or linear, branched, or cyclic organosiloxane oligomers having approximately 4 to 20 silicon atoms having a trialkoxysiloxy group or trialkoxysilylalkyl group, and an epoxy group-bonded alkyl group (e.g., a 3-glycidoxypropyl group, 4-glycidoxybutyl group, 2-(3,4-epoxycyclohexyl) ethyl group, or 3-(3,4-epoxycyclohexyl)propyl group); and reaction products of aminoalkyltrialkoxysilanes and epoxy group-bonded alkyltrialkoxysilanes, and epoxy group-containing ethyl polysilicate. Specific examples of the adhesion promoters include: vinyl trimethoxysilane, allyl trimethoxysilane, allyl triethoxysilane, hydrogen triethoxysilane, 3-glycidoxypropyl trimethoxysilane, 3-glycidoxypropyl triethoxysilane, 2-(3,4-epoxy cyclohexyl)ethyl trimethoxysilane, 3-methacryloxypropyl trimethoxysilane, 3-methacryloxypropyl triethoxysilane, reaction products of 3-glycidoxypropyl triethoxysilane and 3-aminopropyl triethoxysilane, condensation reaction products of silanol group chain-terminated methylvinylsiloxane oligomers and 3-glycidoxypropyltrimethoxysilane, condensation reaction products of silanol group chain-terminated methylvinylsiloxane oligomers and 3-methacryloxypropyl triethoxysilane, and tris(3-trimethoxysilylpropyl) isocyanurate.

The composition of the present invention can further comprise, as optional components, an organopolysiloxane other than components (A) to (H); an inorganic filler such as silica, glass, alumina, or zinc oxide; a fine-powdered organic resin such as polymethacrylate resin; a heat resistance agent; a dye; a pigment; a phosphor; a flame resistance agent; a solvent; or the like to the extent that such optional components do not adversely affect, among other features, the optical and physical properties of the compositions of the various embodiments of the present invention.

In some embodiments, the composition of the various embodiments of the present invention comprise at least one type of organopolysiloxane block copolymer. In some embodiments, the organopolysiloxane block copolymer comprises, in some embodiments:
from 40 to 90 mol % of a disiloxy unit represented by $[R^6_2SiO_{2/2}]$;
from 10 to 60 mol % of a trisiloxy unit represented by $[R^7SiO_{3/2}]$; and
from 2 to 25 mol % of a silanol group represented by $[\equiv SiOH]$;
wherein
each $R^6$ independently representing a $C_1$-$C_{30}$ hydrocarbon group;
each $R^7$ independently representing a $C_1$-$C_{20}$ hydrocarbon group;

the disiloxy unit $[R^6_2SiO_{2/2}]$ being present in a straight chain block comprising an average of from 10 to 400 (e.g., 50 to 300) disiloxy units $[R^6_2SiO_{2/2}]$;
the trisiloxy unit being present in a non-straight chain block having a molecular weight of at least 500 g/mol; and
each straight chain block being bonded to at least one non-straight chain block.

Examples of the hydrocarbon groups include the monovalent hydrocarbon groups described herein.

The organopolysiloxane block copolymer has a weight average molecular weight (Mw) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymer has a weight average molecular weight (Mw) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In still other embodiments, the weight average molecular weight of the organosiloxane block copolymer is from 40,000 to 100,000, from 50,000 to 90,000, from 60,000 to 80,000, from 60,000 to 70,000, of from 100,000 to 500,000, of from 150,000 to 450,000, of from 200,000 to 400,000, of from 250,000 to 350,000, or from 250,000 to 300,000 g/mole. In still other embodiments, the organosiloxane block copolymer has a weight average molecular weight of from 40,000 to 60,000, from 45,000 to 55,000, or about 50,000 g/mole.

In some embodiments, the composition comprising at least one type of organopolysiloxane block copolymer has a refractive index of at least 1.4 as determined using ASTM D542. In some embodiments, the composition comprising at least one type of organosiloxane block copolymer has a refractive index from about 1.4 to about 2.5, e.g., from about 1.5 to about 2.5; from about 1.7 to about 2.4; from about 1.4 to about 1.7; or from about 1.9 to about 2.3.

Examples of acceptable organopolysiloxane block copolymers include those disclosed in WO2012/040457, WO2012/040453, WO2012/040367, WO2012/040305, and WO2012/040302, which are incorporated by reference as if fully set forth herein.

In some embodiments, the present invention relates to a silicone film comprising the composition of the present invention. At least 20 weight % of the silicone film of the present invention is constituted by the composition, at least 50 weight %, at least 70 weight %, at least 90 weight % or, in some embodiments, the film is constituted only by the composition.

The composition and silicone film according to the present invention can comprise at least one type of phosphor. A combination of two or more types of phosphors may also be used. It is thereby possible, if, for example, the composition or silicone film according to the various embodiments of the present invention is used to seal a light-emitting body such as an LED, allowing the wavelength of the emitted light to be converted, and the color of the light emitted by the LED or the like to be adjusted. In addition, because the phosphor is comprised within the sheet, the LED or other light-emitting body can easily be positioned, and the color thereof easily adjusted. Compression molding or laminating can also be performed immediately after adjusting the light emission color to efficiently obtain a seal. Moreover, because the phosphor is not present in a liquid, there is no settling of the phosphor during storage which could lead to a non-uniform concentration distribution.

The phosphor may be any known phosphor, and, in order to increase the thickness of the single-layer sheet and favorably convert wavelengths, the minimum content of phosphor is, in some embodiments, at least 0.01 weight % with respect to the total weight of the composition or silicone film according to the present invention, at least 0.1 weight % or at least 1 weight %. In other embodiments, to convert wavelengths while reducing the thickness of the single-layer sheet, the minimum content of phosphor is, in some embodiments, 10 weight %, 20 weight % or 50 weight %. In still other embodiments, to convert wavelengths while reducing the thickness of the single-layer sheet, the maximum content of phosphor is, in some embodiments, 95 weight %, 90 weight %, 80 weight % or 50 weight %. In yet other embodiments, to convert wavelengths while increasing the thickness of the single-layer sheet, the maximum content of phosphor is 30 weight %, 20 weight % or 10 weight %. The phosphor has a particle size range as measured, for example, in particle distribution measurement via a laser photodiffraction method utilizing a CILAS laser measurement device or the like, such that particle size is, in some embodiments, at least 10 nm, from 10 nm to 100 μm or 100 nm to 30 μm.

There is no particular limitation upon the thickness of the silicone film according to the present invention; for example, from 10 μm to 10 mm or from 20 μm to 5 mm.

The phosphor may be any phosphor that is capable of absorbing, for example, light from an LED and converting the light to a different wavelength. Examples include one or more of nitride and oxynitride phosphors primarily activated by a lanthanide element such as europium or cerium, alkaline earth halogen apatite phosphor primarily activated by a lanthanide such as europium or a transition metal element such as manganese, alkali earth metal boric acid halogen phosphors, alkali earth metal aluminate phosphors, alkaline earth silicate phosphors, alkaline earth sulfide phosphors, alkaline earth thiogallate phosphors, alkaline earth silicon nitride phosphors, germanate phosphors, rare earth luminate phosphors primarily activated by a lanthanide element such as cerium, rare earth silicate phosphors, organic and organic complex phosphors primarily activated by a lanthanide element such as europium, and Ca—Al—Si—O—N based oxynitride glass phosphors. Specific examples of acceptable phosphors are listed below, but the present invention is not limited thereto.

An example of the nitride phosphor primarily activated by a lanthanide element such as europium or cerium includes $M_2Si_5N_8$:Eu (wherein M is at least one selected from strontium, calcium, barium, magnesium and zinc). In addition to $M_2Si_5N_8$:Eu, other examples include $MSi_7N_{10}$:Eu, $M_{1.8}Si_5O_{0.2}N_8$:Eu, and $M_{0.9}Si_7O_{0.1}N_{10}$:Eu (wherein M is at least one selected from strontium, calcium, barium, magnesium and zinc).

An example of the oxynitride phosphor primarily activated by a lanthanide element such as europium or cerium includes $MSi_2O_2N_2$:Eu (wherein M is at least one selected from strontium, calcium, barium, magnesium and zinc).

An example of the alkaline earth halogen apatite phosphor primary activated by a lanthanide element such as europium or a transition metal element such as manganese includes $M_5(PO_4)_3X$:R (wherein M is at least one selected from strontium, calcium, barium, magnesium and zinc; X is at least one selected from fluorine, chlorine, bromium, and iodine; and R is at least one selected from europium, manganese, or europium and manganese).

An example of the alkali earth metal boric acid halogen phosphor includes $M_2B_5O_9X$:R (wherein M is at least one selected from strontium, calcium, barium, magnesium and zinc; X is at least one selected from fluorine, chlorine, bromium, and iodine; and R is at least one selected from europium, manganese, or europium and manganese).

Examples of the alkali earth metal aluminate phosphor include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (wherein R is at least one selected from europium, manganese, or europium and manganese).

Examples of the alkaline earth sulfide phosphors include $La_2O_2S$:Eu, $Y_2O_2S$:Eu, and $Gd_2O_2S$:Eu.

An example of the rare earth aluminate phosphor primarily activated by a lanthanide element such as cerium includes a YAG phosphor represented by the composition formulas $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$. Other examples include phosphors in which the yttrium is partially or entirely substituted by terbium, lutetium, or the like, such as $Tb_3Al_5O_{12}$:Ce and $Lu_3Al_5O_{12}$:Ce.

Other phosphors include ZnS:Eu, Zn2GeO4:Mn, and $MGa_2S_4$:Eu (wherein M is at least one selected from strontium, calcium, barium, magnesium and zinc; and X is at least one selected from fluorine, chlorine, bromium, and iodine).

The abovementioned phosphors can also contain, instead of or in addition to europium, at least one selected from terbium, copper, silver, gold, chromium, neodymium, dysprosium, cobalt, nickel, and titanium.

A Ca—Al—Si—O—N based oxynitride glass phosphor is a phosphor constituted by an oxynitride glass as a matrix material, and comprising from 20 to 50 mol % $CaCO_3$ in terms of CaO, from 0 to 30 mol % $Al_2O_3$, from 25 to 60 mol % SiO, from 5 to 50 mol % AlN, and from 0.1 to 20 mol % of a rare earth oxide or transition metal oxide, the total of the five components being 100 mol %. The phosphor constituted by an oxynitride glass as a matrix material contains no more than 15 weight % nitrogen, and the fluorescent glass preferably contains, apart from the rare earth oxide ion, from 0.1 to 10 mol % of another rare earth element ion constituting a sensitizer as a rare earth oxide as a co-activator.

Another phosphor other than that described above and having similar properties and effects can also be used.

A composition or silicone film according to the various embodiments of the present invention can be manufactured by mixing the composition according to the present invention and one or more of the inorganic particles and/or phosphors described above as necessary, and heating the obtained mixture for a comparatively short time to partially crosslink it. The heating temperature is from 50 to 200° C. or from 80 to 150° C. The heating time is from 1 to 20 minutes or from 5 to 15 minutes. The composition according to the present invention or the mixture forms a silicone film of the present invention that is partially crosslinked via a hydrosilylation reaction and is a solid with high hardness at room temperature, and that is a crosslinked product that softens or liquefies at high temperatures, such as 100° C. or above.

The present invention also relates to a laminate comprising at least one layer containing the composition according to the present invention, e.g., a laminate comprising the silicone film and at least one other sheet.

There is no particular limitation upon the thickness of the laminate according to the present invention; for example, from 10 μm to 10 mm, from 100 μm to 8 mm or from 0.5 to 5 mm.

There is no particular limitation upon the thickness of the other sheet, when present, which may have the same thickness as the silicone film according to the present invention, or may be thinner, as necessary, in which case a thickness of, for example, from 0.1 μm to 3 mm or from 1 μm to 2 mm.

The other sheet, when present, can be a supporter sheet for supporting the silicone film. The supporter sheet may be a single-layer sheet, or a multi-layer sheet in which a plurality of films are layered. The other sheet may also be a protective sheet for preventing dust and the like from adhering to the silicone film. There is no particular limitation upon the material of the supporter sheet as long as it is capable of supporting the silicone film. There is no particular limitation upon the material of the protective sheet as long as it is capable of being peeled from the silicone film. Examples of supporter sheet and protective sheet materials include polyethylene, polypropylene, polycarbonate, polyethylene terephthalate, polybutylene terephthalate, polyamide, polyvinylidene chloride, polystyrene, polyvinyl alcohol, polyimide, polytetrafluoroethylene, ethylene-tetrafluoroethylene copolymer resin, cellulose triacetate, and the like. A surface-treating agent such as a fluorine-containing release agent or a silicone-containing release agent may be applied to the surface of the supporter sheet or protective sheet. The supporter sheet may be peeled off before or during compression molding or laminating. The supporter sheet may be machined simultaneously with the silicone composition layer; in such cases, the sheet may be peeled off the silicone composition layer after machining, or may be left bonded to the silicone composition layer.

The other sheet, when present, may comprise at least one type of non-hot melt curable silicone composition, such as those described in PCT Appl. No. PCT/US2013/077074, filed Dec. 20, 2014, the entire disclosure of which is incorporated by reference as if fully set forth herein.

EXAMPLES

Three non-limiting types of molds are described herein.
Mold Type-A: A nano pillar pattern mold COP (cyclic olefin polymer) film FLP230/200/460-120 (phi 230 nm, pattern height 200 nm, pitch 400 nm, 0.2 mm film thick, purchased from Kyodo International, Inc).
Mold Type-B: A random moth-eye pattern metal mold, (produced by Tokai Seimitsu Kogyo Co., LTD, pattern height: 212 nm, pattern pitch: 130 nm).
Mold Type-C: A Micro Mesh, (mesh count 325, wire diameter 280 μm).

The LED device described below in the various non-limiting examples was MA5050-A2, (Size: 50×50 mm, having 100 LED chips on the board) without white dome around LED chip area. Size of LED chip on the LED device MA5050 was 260 μm×585 μm, 90 μm thick.

Table 1, below, summarizes the patterned s described in the various non-limiting examples presented herein.

TABLE 1

| Example Number | Hot melt silicone film # | Pattern Size | Pattern Shape | Release Liner |
|---|---|---|---|---|
| 6 | 1 | Nano | Pillar | Patterned COP film (Mold Type A) |
| 7 | | Nano | Moth-eye | Ethylene tetrafluoroethylene (ETFE) release film 1 patterned with Mold Type B |
| 8 | | Micro | Mesh | Metal mesh (Mold Type-C) |
| 9 | | Micro | Mesh | ETFE release film 2 patterned with Mold Type C |
| 10 | 2 | | | |
| 11 | 3 | | | |
| 12 | 4 | | | |
| 13 | 5 | | | |
| Ref. Ex. 1 | 1 | No-pattern | No mold | ETFE release film |

Example 1: Hot Melt Silicone Film 1

A 2 L 3-neck round bottom flask is loaded with 544 g toluene and 216 grams of a Phenyl-T Resin (FW=136.6 g/mole Si; 35.0 g, 0.256 moles Si). The flask is equipped with a thermometer, Teflon stir paddle, and a Dean Stark apparatus prefilled with toluene and attached to a water-cooled condenser. A nitrogen blanket is then applied. An oil bath is used to heat the flask at reflux for 30 minutes. Subsequently, the flask is cooled to about 108° C. (pot temperature).

A solution of toluene (176 g) and silanol terminated PhMe siloxane (140 dp, FW=136.3 g/mole Si, 1.24 mole % SiOH, 264 g) is then prepared and the siloxane is capped with 50/50 MTA/ETA (Avg. FW=231.2 g/mole Si, 4.84 g, 0.0209 moles Si) in a glove box (same day) under nitrogen by adding 50/50 MTA/ETA to the siloxane and mixing at room temperature for 2 hours. The capped siloxane is then added to the Phenyl-T Resin/toluene solution at 108° C. and refluxed for about 2 hours.

After reflux, the solution is cooled back to about 108° C. and an additional amount of 50/50 MTA/ETA (Avg. FW=231.2 g/mole Si, 38.32 g, 0.166 moles Si) is added and the solution is then refluxed for an additional 2 hours.

The solution is then cooled to 90° C. and 33.63 g of DI water is added. The solution is then heated at reflux for one hour and water is removed via azeotropic distillation. The solution is then heated for an additional 3 hours and then cooled to 100° C. Subsequently, 4.8 grams of Darco G60 carbon black is added and the solution is cooled to room temperature with stirring and stirred overnight at room temperature. And then pressure filtered through a 5.0 μm filter to isolate the solid composition.

The solid composition, 50.01 g, is then dissolved in toluene to form a 58.2% solids solution. 0.15 grams of a 1 weight percent DBU catalyst/toluene solution is then added and the solution is distilled at 30° C. and 13 Torr for 2 hours to obtain 36.05 g (80.7% solid solution). Subsequently, this solution is cast at about 1 mm thickness on PET film, followed by drying under nitrogen over for 4 days. Excess solvent is then further removed under vacuum at 50° C. for 2 hours in a vacuum oven. A hot melt silicone film 1 with thickness of 400 μm was obtained by pressing the solid composition at 80° C.

Example 2: Hot Melt Silicone Film 2 (B-Staged)

75 parts by mass of a methylvinylpolysiloxane represented by the average unit formula: $(MeViSiO_{2/2})_{0.25}$ $(Ph_2SiO_{2/2})_{0.3}(PhSiO_{3/2})_{0.45}$, 25 parts by mass of a trisiloxane represented by the formula: $(HMe_2SiO)_2SiPh_2$, 10 parts by mass of a methylphenylpolysiloxane represented by $ViMe_2SiO(MePhSiO)_{17.5}SiViMe_2$, a 1,3-divinyl-1,1,3,3-tetramethyldisiloxane solution of platinum-1,3-divinyl-1,1,3,3-methyldisiloxane (in an amount such that there were 40 ppm in terms of mass of metallic platinum with respect to the total amount of the composition), and ethyny hexanol (in an amount equivalent to 600 ppm in terms of mass with respect to the total amount of the composition) were added and mixed to homogeneity to prepare a liquid hydrosilylation curable silicone composition having a viscosity at 25° C. of 8,630 mPa·s. The obtained silicone composition was poured into a 1 cm-thick mold, heated in a press at 100° C. for 30 minutes, and cooled, after which measurement of type A hardness at 25° C. yielded a result of 68. The obtained silicone composition was heated in a hot press at 100° C. for 30 minutes to obtain a 400 micrometer-thick transparent hot melt silicone film 2.

Example 3: Hot Melt Silicone Film 3

35 parts by mass of an organopolysiloxane represented by the following average unit formula:

$(Me_2ViSiO_{1/2})_{0.08}(Me_3SiO_{1/2})_{0.44}(SiO_{4/2})_{0.52}$ that is solid at 25° C., 11 parts by mass of an organopolysiloxane represented by the following formula:

$Me_2ViSiO(SiMe_2O)_{80}SiMe_2Vi$ that is liquid at 25° C., and 4 parts by mass of an organopolysiloxane represented by the following formula:

$Me_2HSiO(SiMe_2O)_{30}SiMe_2H$ that is liquid at 25° C. were dissolved in 50 parts by mass of xylene. A 1,3-divinyl-1,1,3,3-tetramethyldisiloxane solution of platinum-1,3-divinyl-1,1,3,3-tetramethyldisiloxane (in an amount such that the amount of metallic platinum was 5 ppm in terms of mass with respect to the total amount of composition) was added and heated in a flask at 100° C. for 6 hours. No silicon atom-bonded hydrogen atoms were detected via FT-IR, confirming the progress of the hydrosilylation reaction. Four parts by mass of an organopolysiloxane represented by the following average formula:

$Me_3SiO(SiMeHO)_{20}SiMe_3$ that is liquid at 25° C. and ethynyl hexanol (in an amount equivalent to 1,000 ppm in terms of mass with respect to the total amount of composition) were added to the obtained solution, and the whole was mixed, after which the xylene was removed using a rotary evaporator at 80° C. to prepare a hydrosilylation curable silicone composition. A hot melt silicone film 3 with thickness of 400 μm was obtained by pressing the liquid hydrosilylation curable silicone composition at 100° C.

Example 4: Hot Melt Silicone Film 4

43 parts by mass of an organopolysiloxane represented by the following average unit formula:

$(Me_2ViSiO_{1/2})_{0.25}(PhSiO_{3/2})_{0.75}$ that is solid at 25° C. and 7 parts by mass of 1,1,5,5-hexamethyl-3,3-diphenyltrisiloxane that is liquid at 25° C. were dissolved in 50 parts by mass of toluene. A 1,3-divinyl-1,1,3,3-tetramethyldisiloxane solution of platinum-1,3-divinyl-1,1,3,3-tetramethyldisiloxane (in an amount such that the amount of metallic platinum was 5 ppm in terms of mass with respect to the total amount of composition) was added and heated in a flask at 100° C. for 6 hours. No silicon atom-bonded hydrogen atoms were detected via FT-IR, confirming the progress of the hydrosilylation reaction. Six parts by mass of an organopolysiloxane represented by the following average unit formula:

$(Me_2HSiO_{1/2})_{0.60}(PhSiO_{3/2})_{0.40}$ that is liquid at 25° C. and ethynyl hexanol (in an amount equivalent to 1,000 ppm in terms of mass with respect to the total amount of composition) were added to the obtained solution, and the whole was mixed, after which the toluene was removed using a rotary evaporator at 80° C. to prepare a hydrosilylation curable silicone composition. A hot melt silicone film 4 with thickness of 400 μm was obtained by pressing the liquid hydrosilylation curable silicone composition at 100° C.

Example 5: Hot Melt Silicone Film 5 (A-Staged)

43 parts by mass of an organopolysiloxane represented by the following average unit formula:

$(MeViSiO_{2/2})_{0.10}(Me_2SiO_{2/2})_{0.15}(PhSiO_{3/2})_{0.75}$ that is solid at 25° C., and 7 parts by mass of an organopolysiloxane represented by the following formula:

$(Me_2HSiO_{1/2})_{0.60}(PhSiO_{3/2})_{0.40}$ that is liquid at 25° C. were dissolved in 50 parts by mass of toluene. A 1,3-divinyl-1,1,3,3-tetramethyldisiloxane solution of platinum-1,3-divinyl-1,1,3,3-tetramethyldisiloxane (in an amount such that the amount of metallic platinum was 5 ppm in terms of mass with respect to the total amount of composition) and 0.001 parts by mass 1,3-bis(diphenylphosphino)propane were added and mixed, after which the toluene was removed using a rotary evaporator at 60° C., thereby preparing a solid hydrosilylation curable silicone composition. The obtained solid hydrosilylation curable silicone composition was compressed using a 100° C. press to obtain a 400 micrometer-thick hot melt silicone film 5.

Example 6

A hot melt silicone film 1 was contacted on an LED device MA5050-A2 (Size: 50×50 mm, having 100 LED chips on the board, without white dome around LED chip area). The LED device and the hot melt silicone film 1 were set in a vacuum laminator, (product name: Laminator 0505S, produced by Nisshinbo Mechatronics Inc.). A patterned COP film (Mold Type-A) was positioned on the hot melt silicone film 1 with the pattern on COP film facing the hot melt silicone film 1. Then, air of the first chamber and the second chamber was vacuumed. As the second chamber was ventilated, the hot melt silicone film 1 was laminated on the LED device pressed by the patterned COP film at 135° C. for 20 minutes. Silicone encapsulant 1 on the LED device was obtained. After releasing the patterned COP film, weak blue or green light refection of special characteristic of nano patterned surface was observed on the silicone encapsulant 1. Surface of the silicone encapsulant 1 was scanned by SPM (Scanning Probe Microscope). Obtained SPM image showed that the surface has many nano size dimples. Cross section of the silicone encapsulant 1 was observed by SEM (Scanning Electron Microscope). The depth of the imprinted dimples was around 120 nm to 160 nm.

Example 7

ETFE release film 1 was obtained by pressing A random moth-eye pattern metal mold (Mold Type B) on the ETFE release film by vacuum hot press at 150° C. A hot melt silicone film 1 was contacted on an LED device MA5050-A2 (Size: 50×50 mm, having 100 LED chips on the board, without white dome around LED chip area). The LED device and the hot melt silicone film 1 were set in a vacuum laminator, (product name: Laminator 0505S, produced by Nisshinbo Mechatronics Inc.). The ETFE release film 1 was positioned on the hot melt silicone film 1 with the pattern of the ETFE release film 1 facing the hot melt silicone film 1. Then, air of the first chamber and the second chamber was vacuumed. As the second chamber was ventilated, the hot melt silicone film 1 was laminated on the LED device pressed by ETFE release film 1 at 135° C. for 20 minutes. Silicone encapsulant 2 on the LED device was obtained. After releasing the release film, imprinted surface pattern of the silicone encapsulant 2 was observed by SPM.

Example 8

A hot melt silicone film 1 was contacted on an LED device MA5050-A2 (Size: 50×50 mm, having 100 LED chips on the board, without white dome around LED chip area). The LED device and the hot melt silicone film 1 were set in a vacuum laminator, (product name: Laminator 0505S, produced by Nisshinbo Mechatronics Inc.). A flat ETFE film was positioned on the hot melt silicone film 1. Then, air of the first chamber and the second chamber was vacuumed. As the second chamber was ventilated, the hot melt silicone film 1 was laminated on the LED device pressed by ETFE film at 135° C. for 20 minutes. After releasing the ETFE film, the obtained LED assembly was cured in oven at 170° C. for 3 hours. A metal mesh (Mold Type-C) was put on the silicone encapsulant, then the mesh was pressed by the vacuum laminator at 135° C. After releasing the metal mesh, silicone encapsulant 3 in the LED assembly was obtained. Imprinted surface pattern of the silicone encapsulant 3 was observed by optical microscope.

Example 9

ETFE release film 2 was obtained by pressing a micro mesh (Mold Type-C) on the ETFE release film by vacuum hot press at 150° C. A hot melt silicone film 1 was contacted on an LED device MA5050-A2 (Size: 50×50 mm, having 100 LED chips on the board, without white dome around LED chip area). The LED device and the hot melt silicone film 1 were set in a vacuum laminator, (product name: Laminator 0505S, produced by Nisshinbo Mechatronics Inc.). The ETFE release film 2 was positioned on the hot melt silicone film 1 with the pattern of the ETFE release film 2 facing the hot melt silicone film 1. Then, air of the first chamber and the second chamber was vacuumed. As the second chamber was ventilated, the hot melt silicone film 1 was laminated on the LED device pressed by the ETFE release film 2 at 135° C. for 20 minutes. Silicone encapsulant 4 on the LED device was obtained. After releasing the release film, imprinted surface pattern of the silicone encapsulant 4 was observed by SPM.

Example 10

By the same process as described in Example 9, the hot melt silicone film 2 was laminated on the LED device at 150° C. for 10 minutes instead of the hot melt silicone film 1. Silicone encapsulant 5 on the LED device was obtained. After releasing the release film, imprinted surface pattern of the silicone encapsulant 5 was observed by SPM.

Example 11

By the same process as described in Example 9, the hot melt silicone film 3 was laminated on the LED device at 150° C. for 10 minutes instead of the hot melt silicone film 1. Silicone encapsulant 6 on the LED device was obtained. After releasing the release film, imprinted surface pattern of the silicone encapsulant 5 was observed by SPM.

Example 12

By the same process as described in Example 9, the hot melt silicone film 3 was laminated on the LED device at 150° C. for 10 minutes instead of the hot melt silicone film 4. Silicone encapsulant 7 on the LED device was obtained. After releasing the release film, imprinted surface pattern of the silicone encapsulant 7 was observed by SPM.

Example 13

By the same process as described in Example 9, the hot melt silicone film 5 was laminated on the LED device at 150° C. for 10 minutes instead of the hot melt silicone film 5. Silicone encapsulant 8 on the LED device was obtained. After releasing the release film, imprinted surface pattern of the silicone encapsulant 8 was observed by SPM.

Reference Example 1

By the same process as described in Example 6, the hot melt silicone film 1 was laminated by flat ETFE film instead of the patterned COP film. Silicone encapsulant 9 on the LED device was obtained. After releasing the ETFE film, flat surface of the silicone encapsulant 9 was observed by SPM.

Example 13: Light Output (LOP) Measurement

The LOP of the LED assemblies obtained in Example 7 and Reference Example 1 were measured by HalfMoon, (produced by Otsuka Electronics Co., LTD). Before lamination process, LOP of LED devices used in Example 7 and Reference Example 1 were 1740 and 1744 mW at electric current 700 mA, respectively. After the lamination, those were 1772 and 1762, respectively. LOP ratio (LOP after lamination/before lamination) was calculated. LOP of LED assembly in Example 7 was better than that in Reference Example 1.

TABLE 2

|  | Reference Example 1 | Example 7 |
|---|---|---|
| LOP before lamination (mW) | 1744 | 1740 |
| LOP after lamination (mW) | 1762 | 1772 |
| Ratio of LOP (after lamination/before lamination) (%) | 101.0 | 101.8 |

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein. In addition, where features or aspects of the invention are described in terms of Markush groups, those skilled in the art will recognize that the invention is also thereby described in terms of any individual member or subgroup of members of the Markush group.

As used herein and in the appended claims, the singular forms "a," "an," and "the" include plural reference unless the context clearly dictates otherwise. Thus, for example, a reference to "a reactor" includes a plurality of reactors, such as in a series of reactors. In this document, the term "or" is used to refer to a nonexclusive or, such that "A or B" includes "A but not B," "B but not A," and "A and B," unless otherwise indicated.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In the methods described herein, the steps can be carried out in any order without departing from the principles of the invention, except when a temporal or operational sequence is explicitly recited. Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range.

All publications, including non-patent literature (e.g., scientific journal articles), patent application publications, and patents mentioned in this specification are incorporated by reference as if each were specifically and individually indicated to be incorporated by reference.

What is claimed is:

1. A method of making an optical assembly, comprising:
    securing an optical device in a fixture, the optical device having an optical surface, wherein a silicone film is positioned with respect to the optical surface, the silicone film having a distal surface relative to the optical surface;
    positioning a release liner with a liner surface facing the silicone film, the release liner including an imprint on the liner surface; and
    pressing the release liner against the silicone film, thereby causing the imprint of the release liner to be imparted to the distal surface of the silicone film creating a surface imprint in the distal surface.

2. The method of claim 1, wherein a thickness of the silicone film is greater than a thickness of the optical device.

3. The method of claim 1, further comprising applying heat with a heat source to the silicone film to laminate the silicone film to the optical device.

4. The method of claim 1, wherein the silicone film comprises a silicone-containing hot melt composition.

5. The method of claim 4, wherein the silicone-containing hot melt composition comprises an organosiloxane block copolymer comprising:
    from 40 to 90 mol % of a disiloxy unit represented by $[R^6_2SiO_{2/2}]$;
    from 10 to 60 mol % of a trisiloxy unit represented by $[R^7SiO_{3/2}]$; and
    from 2 to 25 mol % of a silanol group represented by $[\equiv SiOH]$;
    each $R^6$ independently representing a $C_1$-$C_{30}$ hydrocarbon group;
    each $R^7$ independently representing a $C_1$-$C_{20}$ hydrocarbon group;
    the disiloxy unit $[R^6_2SiO_{2/2}]$ being present in a straight chain block comprising an average of from 50 to 300 disiloxy units $[R^6_2SiO_{2/2}]$;
    the trisiloxy unit being present in a non-straight chain block having a molecular weight of at least 500 g/mol; and
    each straight chain block being bonded to at least one non-straight chain block.

6. The method of claim 1, wherein the silicone film comprises a silicone-containing hot melt composition selected from the group consisting of:
    (1) an unreacted hydrosilylation curable silicone composition;
    (2) a hydrosilylation curable silicone composition obtained by partially cross-linking an unreacted hydrosilylation curable silicone composition; and
    (3) a hydrosilylation curable silicone composition comprising: a crosslinked product having silicon atom-bonded hydrogen atoms and/or alkenyl groups; and at least one type of hydrosilylation reactive component, the crosslinked product being obtained by cross-linking an unreacted hydrosilylation reactive silicone composition.

7. The method of claim 6, wherein the silicone film comprises a silicone-containing hot melt composition comprises:
    (A) at least one type of organopolysiloxane that is solid at 25° C. and has on average more than two alkenyl groups in a molecule;
    (B) at least one type of organopolysiloxane containing at least two silicon atom-bonded hydrogen atoms in a molecule, in an amount such that a ratio of a total molar concentration of silicon atom-bonded hydrogen atoms to a total molar concentration of alkenyl groups in component (A) being in a range of 0.2 to 4; and
    (C) a hydrosilylation catalyst in an amount sufficient to effect a hydrosilylation reaction.

8. The method of claim 7, wherein component (A) comprises a mixture of:

(A-1) from 60 to 100 mass % of a branched organopolysiloxane that is solid at 25° C. and has on average more than two alkenyl groups in a molecule; and
(A-2) from 0 to 40 mass % of a straight or partially branched organopolysiloxane that is liquid at 25° C. and has on average at least two alkenyl groups in a molecule.

9. The method of claim 6, wherein the silicone film comprises a silicone-containing hot melt composition comprising a hydrosilylation curable silicone composition (2) obtained by partially cross-linking an unreacted hydrosilylation curable silicone composition obtained by stopping a hydrosilylation reaction at from 50 to 95% conversion of a hydrosilylation reactive silicone composition comprising:
(D) at least one type of organopolysiloxane having on average more than two alkenyl groups in a molecule;
(E) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (D) being in a range of 0.2 to 4; and
(F) a hydrosilylation catalyst in an amount sufficient to effect a hydrosilylation reaction.

10. The method of claim 9, wherein component (D) comprises a mixture of:
(D-1) an organopolysiloxane represented by the following average unit formula:

$(R^1_3SiO_{1/2})_a(R^1_2SiO_{2/2})_b(R^1SiO_{3/2})_c(SiO_{4/2})_d(R^2O_{1/2})_e$ wherein $R^1$ is a phenyl group, an alkyl group or cycloalkyl group having from 1 to 6 carbons, or an alkenyl group having from 2 to 6 carbons, providing that from 60 to 80 mol % of $R^1$ are phenyl groups and from 10 to 20 mol % of $R^1$ are alkenyl groups; $R^2$ is a hydrogen atom or an alkyl group having from 1 to 6 carbons; and "a", "b", "c", "d", and "e" are numbers that satisfy: $0 \le a \le 0.2$; $0.2 \le b \le 0.7$, $0.2 \le c \le 0.6$, $0 \le d \le 0.2$, $0 \le e \le 0.1$, and $a+b+c+d=1$; and
(D-2) an organopolysiloxane represented by the following general formula:

$R^3_3SiO(R^3_2SiO)_mSiR^3_3$ wherein $R^3$ a phenyl group, an alkyl group or cycloalkyl group having from 1 to 6 carbons, or an alkenyl group having from 2 to 6 carbons, providing that from 40 to 70 mol % of $R^3$ are phenyl groups and at least one $R^3$ is an alkenyl group; and "m" is an integer from 5 to 100, in an amount of this component being from 0 to 20 parts by weight per 100 parts by weight of component (D-1).

11. The method of claim 6, wherein the hydrosilylation curable silicone composition (3) comprises:
(G) an alkenyl group-containing crosslinked product obtained by hydrosilylation reaction of an unreacted hydrosilylation reactive silicone composition comprising:
(G-1) at least one type of organopolysiloxane having on average more than two alkenyl groups in a molecule;
(G-2) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in component (G-1) being in a range of 0.3 to 0.9; and
(G-3) a hydrosilylation catalyst in an amount sufficient to effect a hydrosilylation reaction; and (H) at least one type of organopolysiloxane having at least two silicon atom-bonded hydrogen atoms in a molecule, in an amount such that a ratio of a total molar concentration of silicon atom-bonded hydrogen atoms to a total molar concentration of alkenyl groups in the crosslinked product being in a range of 0.1 to 2.0.

12. The method of claim 11, wherein one of the following conditions is satisfied:
(G-1) is an organopolysiloxane having on average more than two alkenyl groups in a molecule and represented by the following average composition formula:

$R^4_xSiO_{(4-x)/2}$ wherein $R^4$ each independently represent a substituted or unsubstituted monovalent hydrocarbon group, provided that from 0.1 to 40 mol % of $R^4$ are alkenyl groups; and "x" is a positive number that satisfies: $1 \le x < 2$;
(G-2) is a diorganopolysiloxane represented by the following general formula:

$HR^5_2Si(R^5_2SiO)_nR^5_2SiH$ wherein $R^5$ each independently represent a substituted or unsubstituted monovalent hydrocarbon group not having an aliphatic unsaturated bond, and "n" is an integer from 0 to 1,000; and
(H) is an organohydrogen polysiloxane represented by the following average composition formula:

$R^5_yH_zSiO_{(4-y-z)/2}$ wherein $R^5$ is as defined above, and "y" and "z" are positive numbers that satisfy: $0.7 \le y \le 0.001 \le z \le 1.0$, and $0.8 \le y+z \le 2.6$.

13. An optical assembly including an optical device having an optical surface and a silicone film disposed on the optical surface, the silicone film having an imprinted surface on a distal surface of the optical surface, created by a process comprising:
securing the optical device in a fixture, wherein the silicone film is positioned with respect to the optical surface;
positioning a release liner with a liner surface facing the silicone film, the release liner including an imprint on the liner surface; and
pressing the release liner against the silicone film, thereby causing the imprint of the release liner to be imparted to the distal surface of the silicone film creating the imprinted surface in the distal surface.

14. The optical assembly of claim 13, wherein the imprint of the release liner comprises at least one cavity having a primary dimension from approximately ten (10) nanometers to approximately five hundred (500) micrometers.

15. The optical assembly of claim 13, wherein the silicone film comprises a silicone-containing hot melt composition.

16. The optical assembly of claim 15, wherein a thickness of the silicone film is greater than a thickness of the optical device.

17. An system for making an optical assembly, comprising:
a fixture configured to secure an optical device and allow a silicone film to be positioned with respect to a optical surface;
a release liner with a liner surface configured to face the silicone film, the release liner including an imprint on the liner surface; and
a pressing mechanism configured to press the release liner against the silicone film, thereby causing the imprint of the release liner to be imparted to a distal surface of the silicone film creating an imprinted surface in the distal surface.

18. The system of claim 17, further comprising a heat source configured to apply heat to the silicone film to laminate the silicone film to the optical device.

19. The system of claim 17, wherein the silicone film comprises a silicone-containing hot melt composition.

20. The system of claim 19, wherein a thickness of the silicone film is greater than a thickness of the optical device.

* * * * *